United States Patent [19]
Stolka et al.

[11] Patent Number: 5,206,103
[45] Date of Patent: Apr. 27, 1993

[54] PHOTOCONDUCTIVE IMAGING MEMBER WITH A CHARGE TRANSPORT LAYER COMPRISING A BIPHENYL DIAMINE AND A POLYSILYLANE

[75] Inventors: Milan Stolka, Fairport; Martin A. Abkowitz, Webster, both of N.Y.

[73] Assignee: Xerox Corporation, Stamford, Conn.

[21] Appl. No.: 640,712

[22] Filed: Jan. 14, 1991

[51] Int. Cl.$^5$ .................. G03G 5/06; G03G 5/14
[52] U.S. Cl. .................. 430/59; 430/60; 430/78; 430/62; 430/63
[58] Field of Search .......... 430/58, 59, 60, 62, 430/63, 76, 78

[56] References Cited

U.S. PATENT DOCUMENTS

| | | | |
|---|---|---|---|
| 4,356,246 | 10/1982 | Tabei et al. | 430/136 |
| 4,544,729 | 10/1985 | Nate et al. | 528/28 |
| 4,618,551 | 10/1986 | Stolka et al. | 430/58 |
| 4,758,488 | 7/1988 | Johnson et al. | 430/59 |
| 4,772,525 | 9/1988 | Badesha et al. | 430/58 |
| 4,774,159 | 9/1988 | Stolka et al. | 430/58 |
| 4,855,201 | 8/1989 | Badesha et al. | 430/58 |
| 4,925,759 | 5/1990 | Hanatani et al. | 430/59 |

OTHER PUBLICATIONS

"Enhanced Hole Drift Mobility in Organopolysilane Doped with Low-Molecular-Weight Charge Carrier Transport Compounds", K. Yokoyama et al., J. Chem. Soc. Chem. Commun., 1990, pp. 805–807.

"A New Series of Electroluminescent Organic Compounds", Nohara et al., Chemistry Letters, The Chemical Society of Japan, 1990, pp. 189 & 190.

"Electroluminescence of Doped Organic Thin Films", C. W. Tang et al., J. Appl. Phys. 65(9), 1 May 1989, pp. 3610 to 3616.

*Primary Examiner*—Marion E. McCamish
*Assistant Examiner*—S. Rosasco
*Attorney, Agent, or Firm*—E. O. Palazzo

[57] ABSTRACT

A photoresponsive imaging member comprised of a photogenerating layer, and a charge transport layer comprised of a mixture of a biphenyl diamine and a polysilylene.

15 Claims, 1 Drawing Sheet

PHOTOCONDUCTIVE IMAGING MEMBER WITH A CHARGE TRANSPORT LAYER COMPRISING A BIPHENYL DIAMINE AND A POLYSILYLANE

BACKGROUND OF THE INVENTION

This invention is generally directed to organic glasses, and layered photoresponsive imaging members thereof. More specifically, the present invention in an embodiment thereof relates to mixtures comprised of polymers and small molecules, such as charge transporting, especially hole transporting molecules, like aryl diamines, and photoconductive members thereof, wherein the mixture functions in embodiments as an exceptional hole transporting medium in that, for example, ultra high hole mobilities are achieved with these mixtures, especially a mixture of a biphenyl diamine compound, such as N,N'-bis(4-methylphenyl)-N,N'-bis(4-ethylphenyl)-[1,1'-(3,3'-dimethyl)biphenyl]-4,4'-diamine (ETPD) and a polysilylene, such as, for example, from about $1 \times 10^{-1}$ to about $10^{-1}$ cm$^2$/volts per second at room temperature, about 25° C. In one embodiment of the present invention, there are provided organic photoconductive layered imaging members comprised of photogenerating layers and charge, especially hole transport layers comprises of organic glasses, and more specifically a mixture comprised of polysilylenes and certain aryl amines dopants as illustrated herein, and more specifically in U.S. Pat. No. 4,833,054, the disclosure of which is totally incorporated herein by reference. In one embodiment of the present invention, there is provided a photoresponsive imaging member or device comprised of a supporting substrate, a photogenerating layer comprised of photogenerating pigments optionally dispersed in a resin binder, and a hole transport layer comprised of a mixture of a polysilylene, reference U.S. Pat. No. 4,618,551, the disclosure of which is totally incorporated herein by reference, and a biphenyl diamine compound, such as N,N'-bis(4-methylphenyl)-N,N'-bis(4-ethylphenyl)-[1,1'-(3,3'-dimethyl)biphenyl]-4,4'-diamine (ETPD). The photoresponsive imaging members of the present invention can be selected for various electrophotographic imaging and printing processes, especially xerographic processes wherein, for example, latent images are formed thereon, followed by development and transfer to a suitable substrate. Furthermore, the charge transporting mixtures of the present invention can, it is believed, be selected for electroluminescent display panels, field effect transistors, wherein, for example, there are usually needed hole drift mobilities of from about $10^{-2}$ to about $10^{-1}$ cm$^2$/volts per second; organic electronic devices, photoelectric devices, such as photocells where high hole mobilities are usually desired, and the like. The present invention in an embodiment is also directed to processes for improving the hole mobilities of various components by the addition thereto of certain aryl amines.

The selection of polysilylenes as hole transport molecules for utilization in layered photoconductive imaging members is known, reference U.S. Pat. No. 4,618,551, the disclosure of which is totally incorporated herein by reference. In column 6 of this patent, it is indicated that there can be selected as the hole transporting compound a number of polysilylenes, about 40 weight percent of a dispersed aryl amine, and about 60 percent of poly(phenyl methylsilylene). With the charge transporting mixtures of the present invention, there is enabled an increase in hole mobility of about a factor of 20 times as compared to the aforementioned 40 to 60 mixture. Also, imaging members with aryl amine hole transport and photogenerting layers are known, reference for example U.S. Pat. No. 4,265,990. Organic glasses exhibiting low charge mobilities, that is for example wherein the hole mobility is about $10^{-3}$ cm$^2$/volts per second at room temperature and electric fields of about $10^5$ volts/centimeter are known, reference H. Jen Yuh and D. M. Pai, paper presented at the Fourth International Conference on Unconventional Photoactive Solids, San Jose Calif., Oct. 16 to Oct. 18, 1989. In the aforementioned paper, there is illustrated that hole mobilities in excess of $10^{-3}$ cm$^2$/volts per second are achieved in a homogeneous glass with about 75 weight percent of N,N'-bis(4-methylphenyl)-N,N'-bis(4-ethylphenyl)-[1,1'-(3,3'-dimethyl)biphenyl]-4,4'-diamine (ETPD) and about 25 weight percent of polystyrene. In the *Journal of Chemical Society*, received Jan. 31, 1990, page 805, there is illustrated enhanced hole drift mobility in organopolysilanes doped with certain low molecular weight charge transport compounds. With the invention of the present application, in embodiments thereof the hole mobilities are substantially higher than those as illustrated in the aforementioned article, for example up to 100 times higher in a number of embodiments.

In a patentability search report there were listed the following U.S. patents: U.S. Pat. No. 4,618,551, mentioned herein; U.S. Pat. No. 4,772,525, which discloses in columns 6 and 7 about 90 percent of poly(phenylmethyl silylene) with about 10 percent by weight of a dispersed aryl amine; U.S. Pat. Nos. 4,758,488; 4,744,159 and 4,855,201 which disclose polysilylene charge transport layers; and as collateral interest according to the searcher U.S. Pat. Nos. 4,356,246 and 4,544,729. The disclosures of each of the aforementioned patents are totally incorporated herein by reference.

Illustrated in U.S. Pat. No. 4,315,981 are organic double layered electrophotographic recording materials consisting of an electroconductive support with a photoconductive double layer of organic materials, which consist of a homogeneous opaque charge carrier producing dyestuff layer obtained from an annealed quinone, or the substitution product thereof selected from the group consisting of dibenzoperylene, quinone, anthraquinone, pyranthrone, dibenzathrone, and flaventhrone, and a transparent top layer of insulating materials of at least one charge transporting compound, which transport layer consists of a charge transporting monomer, reference for example column 2, lines 37 to 56. Further, as indicated in column 4, lines 1 to 22, as the Formula 9 compound for the imaging member of the '981 patent there can be selected dibromo-8,16-pyranthrenedione (Indanthrene Orange RRTS, C.I. 59,705). Moreover, it is indicated in column 4, beginning at around line 53, that the organic dyestuff layer may be applied by vapor depositing the dyestuff in a vacuum. Also, this patent discloses a number of resinous binders for the charge transport layer including polycarbonate resins, reference column 7. Further, in U.S. Pat. No. 3,871,882 there are disclosed layered electrophotographic recording materials containing an electroconductive support material and a photoconductive double layer of organic materials, reference for example the Abstract of the Disclosure. Other representative patents of background interest include U.S. Pat. No. 3,871,882 and 3,973,959.

In Konishiroku Kokai Japanese 59/184349/A2[84/184349], Oct. 19, 1984, there is disclosed the use of selected pyranthrones as charge generator layers in conjunction with hydrazone charge transport layers. Specifically, a solution coated dispersion of dibromo-8,16-pyranthrenedione in a polymer binder can be selected as the charge generator layer. Also, in U.S. Pat. No. 3,877,935 there are disclosed imaging members with dibromo-8,16-pyranthrenedione vacuum coated charge generator layers contiguous with poly(vinyl carbazole) charge transport layers.

As a result of a patentability search in a copending application, there were selected U.S. Pat. Nos. 4,028,102; 4,399,207; 4,454,211; 4,554,231 and 4,714,666. In the '102 patent, there are illustrated diamine condensation products in double layered photoconductive recording elements. More specifically, there are disclosed in the '102 patent condensation products of o-phenylamine diamine or 1,8-diaminylnaphthyline and 4,10-benzothioxanthrene-3,1'-dicarboxylic anhydride of the formulas as illustrated in column 2, and of the formulas 1 to 5, reference column 3, beginning at line 55. The '207 patent discloses electrophotographic photosensitive members with hydrazone compounds of the formula, for example, as illustrated in the Abstract of the Disclosure and in column 2. Examples of charge generating layer materials are illustrated beginning in column 16, line 65, and include, for example, phthalocyanine pigments, perylene pigments, and the like, typical examples of which are specifically recited in columns 17 through 26. The '211 patent discloses electrophotographic photosensitive members with pyrazoline charge transport materials, see for example column 2, beginning at line 35. Specific organic photoconductive materials or charge transporting materials for use in the invention of the '211 patent are illustrated according to the teachings thereof in columns 3 and 4, formulas 1 and 2, of the '211 patent. Charge generating layers for the photoconductive members in the '211 patent are illustrated in column 42, beginning at line 11, and include, for example, organic substances such as pyrylium dyes, thioperylium dyes, perylene pigments, and the like with specific examples of charge generating materials being illustrated in columns 42 to 52. Also, it is disclosed in column 57 that a charge generating layer can be formed on aluminum plate by the vacuum deposition of a perylene pigment having carbon atom bridges at the 1, 12 and 6, 7 positions of the common perylene molecule. In U.S. Pat. No. 4,554,231, there is illustrated an electrophotosensitive member comprised of a layer containing hydrazone compound of the formula, for example, as illustrated in the Abstract of the Disclosure, which hydrazone compound is selected as charge transport material, reference column 5, line 30, and wherein there are selected various charge generating layer materials including, for example, perylium dyes, thiopyrylium dyes, perylene pigments and the like, see column 6, beginning at line 23, and note particularly columns 7 through 12. The use of Vylon 200 on a charge generating layer is disclosed at column 19, lines 15 to 21, and according to the searcher, there is shown at the bottom of column 12 a perylene molecule which may be used, which includes a two carbon atom bridge at both the 1, 12 and 6, 7 positions of a perylene molecule.

Moreover, in U.S. Pat. No. 4,587,189, the disclosure of which is totally incorporated herein by reference, there are illustrated layered imaging members with photoconductive layers comprised of cis and transbis(-benzimidazo)perylene pigments and aryl amine charge transport layers.

Additionally, numerous different xerographic photoconductive members are known including, for example, a homogeneous layer of a single material such as vitreous selenium, or a composite layered device containing a dispersion of a photoconductive composition. An example of one type of composite xerographic photoconductive member is described, for example, in U.S. Pat. No. 3,121,006 wherein there are disclosed finely divided particles of a photoconductive inorganic compound dispersed in an electrically insulating organic resin binder.

There are also known photoreceptor materials comprised of inorganic or organic materials wherein the charge carrier generating, and charge carrier transport functions are accomplished by discrete contiguous layers. Additionally, layered photoreceptor materials are disclosed in the prior art which include an overcoating layer of an electrically insulating polymeric material. However, the art of xerography continues to advance and more stringent demands need to be met by the copying apparatus in order to increase performance standards, and to obtain quality images. Also, there have been disclosed other layered photoresponsive devices including those comprised of separate generating layers, and transport layers as described in U.S. Pat. No. 4,265,990, the disclosure of which is totally incorporated herein by reference. Examples of photogenerating layers disclosed in this patent include trigonal selenium and phthalocyanines, while examples of transport layers include certain diamines as mentioned herein.

Many other patents are in existence describing photoresponsive devices including layered devices containing generating substances, such as U.S. Pat. No. 3,041,167 which discloses an overcoated imaging member containing a conductive substrate, a photoconductive layer, and an overcoating layer of an electrically insulating polymeric material. This member is utilized in an electrophotographic copying system by, for example, initially charging the member with an electrostatic charge of a first polarity, and imagewise exposing to form an electrostatic latent image, which can be subsequently developed to form a visible image.

Furthermore, there are disclosed in U.S. Pat. Nos. 4,232,102 and 4,233,383 photoresponsive imaging members comprised of trigonal selenium doped with sodium carbonate, sodium selenite, and trigonal selenium doped with barium carbonate, and barium selenite, or mixtures thereof. Moreover, there are disclosed in U.S. Pat. No. 3,824,099 certain photosensitive hydroxy squaraine compositions. According to the disclosure of this patent, the squaraine compositions are photosensitive in normal electrostatographic imaging systems.

In U.S. Pat. No. 4,508,803, the disclosure of which is totally incorporated herein by reference, there is described an improved photoresponsive device comprised of a supporting substrate, a hole blocking layer, an optional adhesive interface layer, an inorganic photogenerating layer, a photoconducting composition layer comprised of benzyl fluorinated squaraine compositions, and an aryl amine hole transport layer. Other representative patents disclosing photoconductive devices with photogenerating squaraine and aryl amine charge transport components therein include U.S. Pat. Nos. 4,507,408; 4,552,822; 4,559,286; 4,507,480; 4,524,220;

4,524,219; 4,524,218; 4,525,592; 4,559,286; 4,415,639; 4,471,041 and 4,486,520. The disclosures of each of the aforementioned patents are totally incorporated herein by reference.

SUMMARY OF THE INVENTION

It is therefore a feature of the present invention to provide organic glasses with, for example, high hole transport mobilities.

Another feature of the present invention is to provide organic glasses comprised of a mixture of polysilylenes and certain aryl diamines, hole transport molecules, such as ETPD.

Additionally, in another feature of the present invention there are provided chrge transporting mixtures with ultra high hole mobilities of, for example, from about $10^{-4}$ to about $10^{-1}$ cm$^2$/volt per second at room temperature, about 25° C., as determined by known methods such as the standard flight of time process described by F. K. Dolezalek—*Photoconductivity and Related Phenomena*, edited by Joseph Mort and D. Pai (New York, 1976), pages 27 to 63, the disclosure of the aforementioned book being totally incorporated herein by reference.

Additionally, in another feature of the present invention there are provided hole transporting mixtures with ultra high hole mobilities, and comprised of from about 10 to about 80, and preferably from about 65 to about 75 weight percent of the aryl amines illustrated herein, such as ETPD, and from about 20 to about 90, and preferably from about 35 to about 25 weight percent of the polysilylenes.

Further, in another feature of the present invention there are provided processes for increasing the hole mobilities of charge transporting layers by adding from about 10 to about 80, and preferably from about 65 to about 75 weight percent of the aryl amines illustrated herein, such as ETPD, to from about 20 to about 90, and preferably from about 35 to about 25 weight percent of the polysilylenes, and wherein the hole mobilities are, for example, from about $10^{-4}$ to about $10^{-1}$ cm$^2$/volts per second at room temperature, about 25° C.

A further feature of the present invention is the provision of photoconductive imaging members comprised of photogenerating layers and charge, especially hole transport layers comprised of the charge transporting mixtures illustrated herein, and wherein the members in an embodiment of the invention possess high photosensitivity, low dark decay values, and excellent cyclic stability.

In yet another specific feature of the present invention there are provided negatively charged layered photoresponsive imaging members comprised of photogenerating compounds optionally dispersed in a resinous binder, and in contact therewith a hole transport layer comprised of a mixture of a polysilylene and an aryl amine.

There are provided in another feature of the present invention positively charged layered photoresponsive imaging members with a top photogenerating layer comprised of photogenerating pigments optionally dispersed in a resinous binder, and thereunder a hole transport layer comprised of a mixture of a polysilylene and certain amines.

Further, in yet another feature of the present invention there are provided imaging and printing methods with the photoresponsive imaging members illustrated herein.

Also, in a further feature of the present invention there are provided improved imaging members sensitive to light in the visible region of the spectrum, that is from about 400 to about 700 nanometers.

Moreover, in a further feature of the present invention there can be provided improved imaging members with extended near infrared response to, for example, 800 nanometers, and improved white light response (panchromaticity).

These, and other features of the present invention can be accomplished in embodiments thereof by the provision of organic glasses and layered photoconductive imaging members thereof. In one embodiment, the layered photoconductive imaging members of the present invention are comprised of photogenerating layers, and in contact therewith a charge or hole transport layer or layers comprised of a mixture of polysilylenes and hole transport molecules, especially certain aryl amines, such as bipyphenyl diamines like ETPD.

In a specific embodiment, the photoconductive layered imaging members of the present invention are comprised of, for example, a supporting substrate, a photogenerating layer comprised of photogenerating pigments comprised of selenium, selenium alloys, metal phthalocyanines, metal free phthalocyanines, vanadyl phthalocyanines, titanyl phthalocyanines, perylenes, squaraines, and other similar inorganic or organic photogenerating pigments, such as azo, bis azo, photogenerating pigments, including the photogenerating pigments as illustrated in a number of United States patents such as U.S. Pat. Nos. 4,713,307; 4,797,337; 4,507,471 and 4,833,052, the disclosures of which are totally incorporated herein by reference, and a transport layer, especially hole transport, comprised of a mixture of a polysilylene and a bipyhenyl diamine such as ETPD.

With further respect to the photoconductive imaging members of the present invention, the photogenerating layer can be situated between the supporting substrate and the hole transport layer; or alternatively, the hole transport layer may be situated between the supporting substrate and the layer comprised of known photogenerating pigments. The imaging members may also include protective overcoatings thereover including polymers such as polyurethanes, polycarbonates and the like with a thickness of from about 0.2 micron to about 10 microns, or other effective thicknesses.

In another specific illustrative embodiment, the photoconductive imaging member of the present invention is comprised of (1) a supporting substrate; (2) a hole blocking layer; (3) an optional adhesive interface layer; (4) a photogenerating layer comprised of inorganic, or organic photogenerating pigments; and (5) a charge transport layer comprised of a mixture of a polysilylene and a benzidine, reference U.S. Pat. No. 4,833,054, the disclosure of which is totally incorporated herein by reference, such as ETPD present in an effective amount of, for example, from about 10 to about 80 weight percent. Therefore, the photoconductive imaging member of the present invention in one embodiment is comprised of a conductive supporting substrate, a hole blocking organo silane or siloxane or metal oxide layer in contact therewith, an adhesive layer, such as 49,000 polyester available from Goodyear Chemical, a photogenerating layer overcoated on the adhesive layer, and as a top layer a hole transport layer comprised of a synergistic mixture of a polysilylene and the benzidene present in an effective amount of, for example, from about 40 to about 75 weight percent optionally dispersed in a resinous binder.

Various known processes can be selected for the preparation of the photoconductive imaging members of the present invention, the process parameters in the order of coating of the layers being dependent on the member desired. Specifically, for example, in one method the photogenerating layer is deposited on a supporting substrate by vacuum sublimation, and subsequently the hole transport layer mixture is deposited thereover by solution coating. In another process variant, the layered photoconductive device can be prepared by known processes such as by providing the conductive substrate containing the hole blocking layer and an optional adhesive layer, and applying thereto by solvent coating processes, laminating processes, or other methods, the photogenerating layer, and the charge transport layer mixture. In an embodiment, a photogenerating pigment, such as a perylene, can be vapor deposited on the supporting substrate of a titanized polyester (MYLAR ®) with a silane layer thereover, onto which a 20 micron layer of about 40 weight percent of poly(methylphenylsilylene) and about 60 weight percent of ETPD is deposited by solvent, such as toluene, coating, reference for example U.S. Pat. No. 4,808,506, and copending application U.S. Ser. No. 531,224 (D/90148), the disclosures of which are totally incorporated herein by reference. In an embodiment, about 6 parts by weight of a diphenyl diamine, such as ETPD, and 4 parts by weight of poly(methylphenylsilylene) of a weight average molecular weight of about 300,000 with about 50 parts of toluene with a draw bar coating process can be selected for the preparation of the aforementioned imaging members.

Also, in a embodiment of the present invention the photogenerating pigments selected can be purified prior to incorporation in the imaging members by fractional sublimation, which involves subjecting the pigments to a temperature of from about 500° to about 650° C., whereby impurities and decomposition products more volatile than the desired components are separated at a temperature zone of below 200° C. There are thus obtained the desired purified photogenerating components at a purity of at least about 95 percent at a temperature zone of from about 290° to about 460° C. separated from the nonvolatile impurities, which remain at the high temperature (500° to 650° C.) zone. The sublimation apparatus used has been described by H. J. Wagner et al. in *Journal of Materials Science*, Vol. 17, pages 2781 to 2791 (1982), the disclosure of which is totally incorporated herein by reference.

The improved photoconductive imaging members of the present invention can be incorporated into numerous imaging processes and apparatuses inclusive of those well known in the art such as xerographic imaging and printing processes. Specifically, the imaging members of the present invention are useful in xerographic imaging processes wherein the photogenerating pigments utilized absorb light of a wavelength of from about 400 nanometers to about 700 nanometers. In these processes, electrostatic latent images are initially formed on the imaging member, followed by development, and thereafter transferring the image to a suitable substrate. Other uses for the charge transporting mixtures of the present invention with high hole mobilities are as illustrated herein.

BRIEF DESCRIPTION OF THE DRAWINGS

For a better understanding of the present invention and further features thereof, reference is made to the following detailed description of various preferred embodiments wherein.

DESCRIPTION OF SPECIFIC EMBODIMENTS

Figure 1:
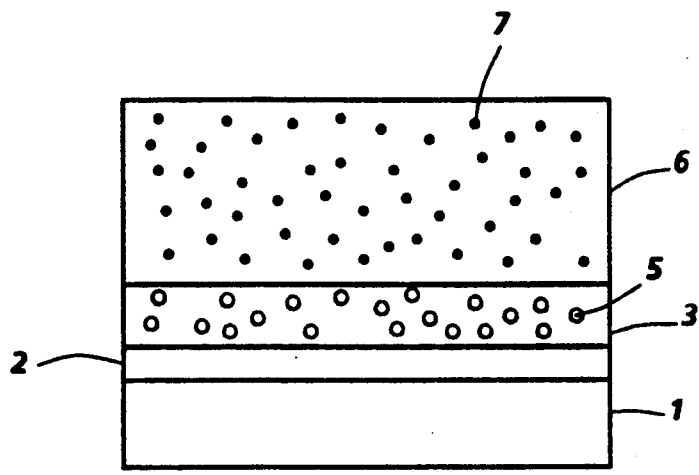
FIG. 1 is a partially schematic cross-sectional view of a photoresponsive imaging member of the present invention in which the photogeneration layer is situated between a substrate and a charge transport layer.

Specific embodiments of the present invention will now be provided with reference to specific photoconductive imaging members wherein:

Illustrated in FIG. 1 is a photoresponsive imaging member of the present invention comprised of a substrate 1, and adhesive layer 2, a photogenerator layer 3 comprised of an inorganic or an organic photogenerating pigment optionally dispersed in in a resinous binder composition 5, and a charge carrier hole transport layer 6 comprised of a mixture of an aryl amine such as N,N'-bis(4-methylphenyl)N,N'-bis(4-ethylphenyl)-[1,1'-(3,3'-dimethyl)biphenyl]-4,4'-diamine (ETPD), and a polysilylene 7.

Figure 2:
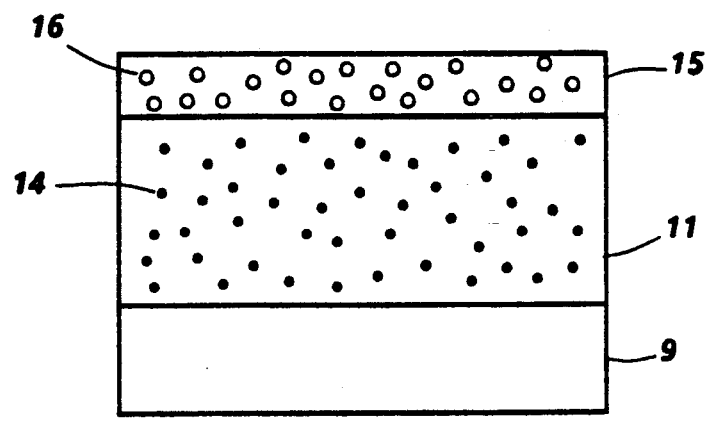
FIG. 2 is a partially schematic cross-sectional view of a photoresponsive imaging member of the present invention in which a charge transport layer is situated between the photogeneration layer and a substrate.

Illustrated in FIG. 2 is a photoresponsive imaging member in which the hole transport layer is situated between the supporting substrate and the photogenerating layer. More specifically, with reference to this Figure, there is illustrated a photoconductive imaging member comprised of a supporting substrate 9, a hole transport layer 11 comprised of a mixture of a byphenyl diamine, such as N,N'-bis(4-methylphenyl)N,N'-bis(4-ethylphenyl)-[1,1'-(3,3'-dimethyl)biphenyl]-4,4'-diamine (ETPA), from about 40 to about 75 weight percent, and a polysilylene 14; and a photogenerating layer 15 comprised of an inorganic or an organic photogenerating pigment optionally dispersed in a resinous binder composition 16.

Figure 3:
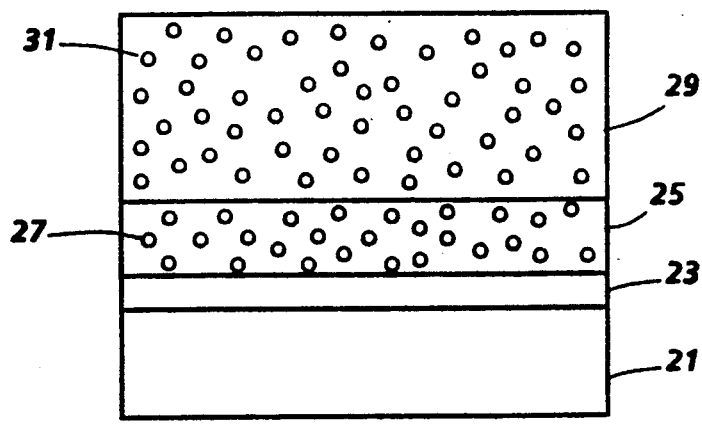
FIG. 3 is a partially schematic cross-sectional view of a photoresponsive imaging member of the present invention.

Illustrated in FIG. 3 is a photoresponsive imaging member which is composed of a supporting substrate 21, such as MYLAR ®, of a thickness of from about 50 to about 250 microns; an adhesive layer 23 of, for example a polyester; a photogenerator layer 25 comprised of an inorganic, or an organic photogenerating pigment, such as amorphous selenium, selenium alloys, metal free phthalocyanines, metal phthalocyanines, vanadyl phthalocyanines, or titanyl phthalocyanines, optionally dispersed in a resinous binder composition 27, and a charge carrier hole transport layer 29 comprised of a mixture of N,N'-bis(4-methylphenyl)N,N'-bis(4-ethylphenyl)-[1,1'-(3,3'-dimethyl)biphenyl]-4,4'-diamine, 75 weight percent, and a polysilylene 31, 25 weight percent.

With further reference to the imaging members of the present invention, the substrates may comprise a layer of insulating material, such as an inorganic or organic polymeric material, including MYLAR ® a commercially available polymer; a layer of an organic or inorganic material having a semiconductive surface layer, such as indium tin oxide or aluminum, arranged thereon, or a conductive material such as, for example, aluminum, chromium, nickel, titanium, brass, or the like. The substrate may be flexible or rigid and many have a number of many different configurations, such as for example a plate, a cylindrical drum, a scroll, an endless flexible belt, a seamless support, and the like. Preferably, the substrate is in the form of an endless flexible belt. In some situations, it may be desirable to coat on the back of the substrate, particularly when the substrate is an organic polymeric material, an anticurl layer, such as for example polycarbonate materials commercially available as MAKROLON ®. The thickness of the substrate layer depends on many factors, including economical considerations, thus this layer may be of substantial thickness, for example over 100 mils, or of minimum thickness providing there are no adverse effects on the system. In one preferred embodiment, the thickness of this layer is from about 3 mils to about 10 mils.

The optional adhesive layers are typically comprised of a polymeric material including polyesters, poly(vinyl butyral), poly(vinyl pyrrolidone), and the like. Typically, this layer is of a thickness of less than about 5 microns, and in an embodiment the thickness of this layer is from about 0.05 to about 5 microns, or from about 0.1 to about 1 micron. The imaging member of the present invention can include other layers therein as illustrated hereinbefore, including metal oxide layers such as aluminum oxide and siloxanes, reference U.S. Pat. No. 4,464,450, the disclosure of which is totally incorporated herein by reference. Generally, the thickness of these layers is from about 0.5 to about 1 micron, however, other thicknesses can be selected providing the objectives of the present invention are achieved.

The photogenerating layers are generally of a thickness of from about 0.05 micron to about 10 microns, or more, and preferably are of a thickness of from about 0.1 micron to about 3 microns; however, the thickness of this layer is primarily dependent on the photogenerator amount which may vary from about 5 to 100 percent. Generally, it is desirable to provide this layer in a thickness which is sufficient to absorb about 90 percent or more of the incident radiation which is directed upon it, and the imagewise or printing exposure step. The maximum thickness of this layer is dependent primarily upon factors such as mechanical considerations, for example, whether a flexible photoconductive imaging member is desired, the thicknesses of the other layers, and the specific pyranthrone compound selected. Examples of photogenerating pigments include selenium, selenium alloys, such as selenium arsenic, selenium tellurium, selenium arsenic tellurium; selenium alloys doped with, for example, a halogen, such as chlorine, in an amount of from about 200 to about 500 parts by weight, metal phthalocyanines, metal free phthalocyanines, vanadyl phthalocyanines, titanyl phthalocyanines, squaraines, perylenes, and the like, including specifically, for example, 2,3-dichlorobisazo squaraine, benzimidazole perylene, reference U.S. Pat. No. 4,587,189, the disclosure of which is totally incorporated herein by reference.

Typical biphenyl diamine hole transport molecules can be selected for the hole transport layer mixture of the present invention, which layer has a thickness, for example, of from about 5 microns to about 75 microns, and preferably is of a thickness of from about 10 microns to about 40 microns. In an embodiment, this transport layer comprises a biphenyl diamine in an effective amount of, for example, from about 40 to about 75 weight percent of the following formula

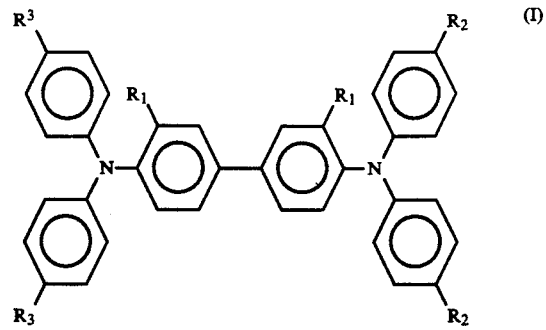

wherein $R_1$ represents an alkyl group with, for example, from 1 to about 5, and preferably from 1 to about 2 carbon atoms, and $R_2$ and $R_3$ represent an alkyl group, or an alkoxy group with, for example, from 1 to about 25, and preferably from 1 to about 4 carbon atoms, which compounds and processes thereof are illustrated, for example, in U.S. Pat. No. 4,833,054, the disclosure of which is totally incorporated herein by reference. The aforementioned known available biphenyl diamines can be prepared by reacting a halogenated benzene derivative represented by Formula (II)

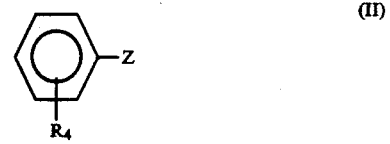

wherein $R_4$ represents an alkyl group, or an alkoxy group with, for example, from 1 to about 25, and preferably 1 to about 4 carbon atoms, and Z represents a halogen, preferably an iodine atom or a bromine atom, with a benzidine derivative represented by Formula (III)

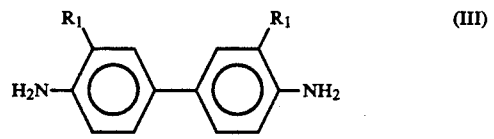

wherein $R_1$ is as illustrated herein in the presence of a copper catalyst and an alkali such as sodium hydroxide; and a polysilylene from about 60 to about 25 weight percent.

For the preparation, the starting halogenated benzene derivatives of Formula (II) are readily available and preferably include those wherein Z is an iodine atom, such as 2-, 3- or 4-iodotoluene. By using the halogenated benzene derivatives having different groups for $R_4$, the compound of Formula (I) having different groups for $R_2$ and $R_3$ can be obtained. The starting benzidine derivatives of Formula (III) are also commercially available and include 3,3'-dimethylbenzidine or o-toluidine. The condensation reaction between the compound of Formula (II) and the compound of Formula (III) can be accomplished in the presence of a copper catalyst and an alkali, with or without a reaction solvent, and with heating. The reaction solvent, if used, preferably includes a high boiling point of from 100° C.

to 250° C., such as dodecane, tridecane, and the like. Since this reaction can be considered a dehydrating reaction and is susceptible to the influence of water, hydrocarbon solvents such as dodecane with poor water solubility are preferred.

The copper catalyst selected includes a copper powder, $Cu_2O$, CuI, CuO, copper bronze, phosphor bronze, and the like, and is preferably added in an amount of from 0.1 to 2 moles per mole of the benzidine derivative of Formula (III). The alkali to be used includes KOH, $K_2CO_3$, NaH, NaOH, $Na_2CO_3$, KH, $CaH_2$, and the like. The alkali is generally added in an amount of 4 moles or more, and preferably from about 4 to about 50 moles, and more preferably from about 6 to about 20 moles per mole of the benzidine derivative. The condensation reaction is usually accomplished at a temperature of from about 100° C. to about 250° C. and preferably from about 150° C. to about 230° C. The halogenated benzene derivative of Formula (II) is usually selected in an amount of at least 4 moles, and preferably from about 4 to about 20 moles per mole of the biphenyl diamine derivative of Formula (III).

After completion of the reaction, water is added to the reaction mixture, and the product is extracted with a solvent, such as methylene chloride, chloroform, an ether, toluene, and the like, which is capable of dissolving the product and is insoluble in water. The resulting extract is treated with activated clay about 10 times the weight of the product and then recrystallized from an appropriate solvent, such as acetone, ethyl acetate, an alcohol, like methanol, ethanol, hexane, toluene, methylene chloride, a mixture of the aforesaid solvents, chloroform, and the like. It is also possible to isolate the desired intermediate product in the course of the reaction. For example, if the reaction is once suspended, and after the desired product is recovered by extracting with a solvent, the reaction may be continued by replenishing the system with fresh catalyst, alkali, and starting compounds. In this situation, a deactivated catalyst or alkali can be removed in the course of the reaction, and the overall reaction time can be shortened.

Alternatively, the same compounds can be obtained by reacting a di-iodo substituted benzidine derivative (IV)

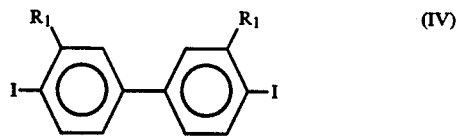

wherein $R_1$ is an alkyl with a diarylamine (V), and I is iodide;

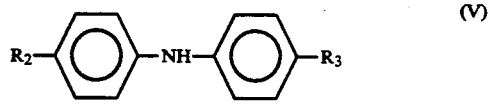

wherein the substituents $R_2$ and $R_3$ are as illustrated herein, by the above condensation reaction in the presence of a copper catalyst and an alkali.

Examples of polysilylenes present in various effective amounts such as, for example, from about 60 to about 40 weight percent include the polysilylenes of U.S. Pat. No. 4,618,551, the disclosure of which is totally incorporated herein by reference. Specific polysilylenes are of the formula

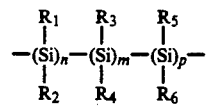

wherein $R_1$, $R_2$, $R_3$, $R_4$, $R_5$, and $R_6$ are independently selected from the group consisting of alkyl, aryl, substituted alkyl, substituted aryl, and alkoxy; and m, n, and p are numbers that reflect the percentage of the particular monomer unit in the total polymer compound. Preferred polysilylenes include poly(methylphenyl silylene), which polysilylenes preferably have a weight average molecular weight of in excess of 1,000, such as from about 5,000 to about 2,000,000. Polysilylenes or polygermylenes with a weight average molecular weight of from about 75,000 to about 1,000,000 are usually selected in some embodiments. The aforementioned polysilylenes can be prepared by known methods, reference the *Journal of Organometallic Chemistry*, page 198, C27, (1980), R. E. Trujillo, the disclosure of which is totally incorporated herein by reference. Also, other polysilylenes can be prepared as described in the *Journal of Polymer Science*, Polymer Chemistry Edition, Vol. 22, pages 225 to 238, (1984), John Wiley and Sons, Inc., the disclosure of which is totally incorporated herein by reference. More specifically, the aforementioned polysilylenes can be prepared as disclosed in the aforesaid article by the condensation of a dichloromethylphenyl silane with an alkali metal such as sodium. In one preparation sequence, there is reacted a dichloromethyl phenyl silane in an amount of from about 0.1 mole with sodium metal in the presence of 200 milliliters of solvent in which reaction is accomplished at a temperature of from about 100° C. to about 140° C. There results, as identified by elemental analysis, infrared spectroscopy, UV spectroscopy, and nuclear magnetic resonance, the polysilylene products subsequent to the separation thereof from the reaction mixture.

Illustrative specific examples of polysilylene compounds that may be selected for the charge transporting mixture of the present invention include poly(methylphenyl silylene), poly(methylphenyl silylene-co-dimethyl silylene), poly(cyclohexylmethyl silylene), poly(di-n-butylmethyl silylene), poly(phenylethyl silylene), poly(n-propylmethyl silylene), poly(p-tolylmethyl silylene), poly(cyclotrimethylene silylene), poly(cyclotetramethylene silylene), poly(cyclopentamethylene silylene), poly(di-t-butyl silylene-co-dimethyl silylene), poly(diphenyl silylene-co-phenylmethyl silylene), poly(cyanoethylmethyl silylene), poly(phenylmethyl silylene), and the like. Preferred polysilylenes selected for the toner compositions of the present invention include poly(methylphenyl) silylene, poly(cyclohexylmethyl) silylene, and poly(phenethylmethyl) silylene.

Also included within the scope of the present invention are methods of imaging with the photoresponsive devices illustrated herein. These methods generally involve the formation of an electrostatic latent image on the imaging member, followed by developing the image with known developer compositions, reference for example U.S. Pat. Nos. 3,590,000; 4,469,770; 4,560,635 and 4,298,672, the disclosures of which are totally incorporated herein by reference; subsequently transferring the image to a suitable substrate; and permanently affixing the image thereto.

Illustrative examples of toners with charge enhancing additives that may be selected for image development and present in the toner or admixed therewith in various effective amounts such as, for example, from about 0.05 to about 10 percent by weight, and more preferably from about 0.5 to about 2 percent by weight, and usually enabling positively charged toner compositions with a triboelectric charge, for example, of from about 15 to about 40 microcoulombs per gram, include alkyl pyridinium halides, such as cetyl pyridinium chlorides, reference U.S. Pat. No. 4,298,672, the disclosure of which is totally incorporated herein by reference; cetyl pyridinium tetrafluoroborates, quaternary ammonium sulfate, and sulfonate charge control agents as illustrated in U.S. Pat. No. 4,338,390, the disclosure of which is totally incorporated herein by reference; stearyl phenethyl dimethyl ammonium tosylates, reference U.S. Pat. No. 4,338,390, the disclosure of which is totally incorporated herein by reference; distearyl dimethyl ammonium methyl sulfate, reference U.S. Pat. No. 4,560,635, the disclosure of which is totally incorporated herein by reference; stearyl dimethyl hydrogen ammonium tosylate, BONTRON TM P51 available from Orient Chemical Company; TP-302 TM, a quaternary ammonium salt available from Nachem, Inc.; charge control agents which have been surface treated with colloidal silicas such as AEROSILS ®; mixtures of colloidal silicas and charge additives; colloidal silicas surface treated with charge control additives; and other known similar charge enhancing additives providing the objectives of the present invention are accomplished; and the like. Examples of charge enhancing additives present in various effective amounts such as, for example, from about 0.05 to about 10 percent by weight, and preferably from about 1 to about 5 percent by weight, and more preferably from about 0.5 to about 2 weight percent that enable negatively charged toners with a triboelectric charge, for example, of from about −15 to about −40 microcoulombs per gram include SPILON TM TRH available from Hodogaya Chemical, orthohalophenylcarboxylic acids, reference U.S. Pat. No. 4,411,974, the disclosure of which is totally incorporated herein by reference, potassium tetraphenyl borates, and the like. With respect to the aforementioned positively charged toners, depending on a number of factors including the carrier selected and the amount of charge enhancing additive utilized, generally the triboelectric charge is from about a +15 microcoulombs per gram to about a +40 microcoulombs per gram, and preferably from a +20 microcoulombs per gram to about a +35 microcoulombs per grams. A similar charge with a negative polarity can be present on the toner with negative charge enhancing additives such as toner of the '974 patent.

Illustrative examples of carrier particles that can be selected for mixing with the toner compositions, thus permitting two component developers, include those particles that are capable of triboelectrically obtaining a charge of opposite polarity to that of the toner particles. Accordingly, the carrier particles can be selected to be of a negative polarity thereby enabling the toner particles which are positively charged to adhere to and surround the carrier particles. Alternatively, there can be selected carrier particles with a positive polarity enabling toner compositions with a negative polarity. Illustrative examples of carrier particles that may be selected include steel, nickel, iron, ferrites, and the like. Additionally, there can be selected as carrier particles nickel berry carriers as disclosed in U.S. Pat. No. 3,847,604, which carriers are comprised of nodular carrier beads of nickel characterized by surfaces of reoccurring recesses and protrusions thereby providing particles with a relatively large external area. Preferred carrier particles selected for the present invention are comprised of a magnetic, such as steel, core with a polymeric coating thereover, several of which are illustrated, for example, in U.S. Ser. No. 751,922 (abandoned) relating to developer compositions with certain carrier particles, the disclosure of which is totally incorporated herein by reference. More specifically, there are illustrated in the aforementioned application carrier particles comprised of a core with a coating thereover of vinyl polymers, or vinyl homopolymers. Examples of specific carriers illustrated in the application, and particularly useful for the present invention are those comprised of a steel or ferrite core with a coating thereover of a vinyl chloride/trifluorochloroethylene copolymer, which coating contains therein conductive particles, such as carbon black. Other coatings include fluoropolymers, such as polyvinylidenefluoride resins, poly(-chlorotrifluoroethylene), fluorinated ethylene and propylene copolymers, terpolymers of styrene, methylmethacrylate, and a silane, such as triethoxy silane, reference U.S. Pat. Nos. 3,467,634 and 3,526,533, the disclosures of which are totally incorporated herein by reference; polytetrafluoroethylene, fluorine containing polyacrylates, and polymethacrylates; copolymers of vinyl chloride and trichlorofluoroethylene; and other known coatings. There can also be selected as carrier components comprised of a core with a double polymer coating thereover, reference U.S. Pat. Nos. 4,937,166 and 4,935,326, the disclosures of which are totally incorporated herein by reference. More specifically, there is detailed in these applications a process for the preparation of carrier particles with substantially stable conductivity parameters which comprises (1) mixing carrier cores with a polymer mixture comprising from about 10 to about 90 percent by weight of a first polymer, and from about 90 to about 10 percent by weight of a second polymer; (2) dry mixing the carrier core particles and the polymer mixture for a sufficient period of time enabling the polymer mixture to adhere to the carrier core particles; (3) heating the mixture of carrier core particles and polymer mixture to a temperature of between about 200° F. and about 550° F. whereby the polymer mixture melts and fuses to the carrier core particles; and (4) thereafter cooling the resulting coated carrier particles.

Also, while the diameter of the carrier particles can vary, generally they are of a diameter of from about 50 microns to about 1,000, and preferably about 500 microns, thus allowing these particles to posses sufficient density to avoid adherence to the electrostatic images during the development process. The carrier particles can be mixed with the toner particles with an average particle diameter of from about 10 to about 25 microns, in various suitable combinations, for example from about 1 to about 5 parts per toner to about 10 parts to about 200 parts by weight of carrier.

The invention will now be described in detail with reference to specific preferred embodiments thereof, it being understood that these examples are intended to be illustrative only. The invention is not intended to be limited to the materials, conditions, or process parameters recited herein. Also, all parts and percentages are by weight unless otherwise indicated.

EXAMPLE I

Preparation of N,N,N',N'-tetrakis-(4-methylphenyl)-3,3'-dimethylbenzidine:

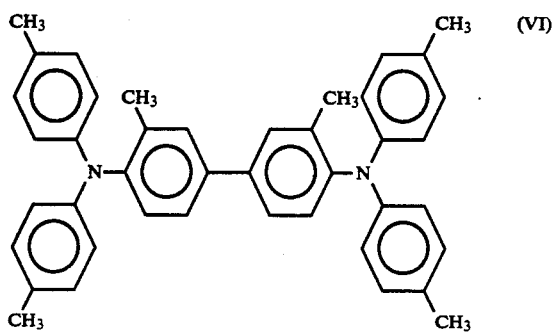

In a round flask there were charged 3.14 grams (13.8 millimoles) of o-toluidine, 40 grams of potassium hydroxide, 400 milligrams of copper iodide, and 30 milliliters of n-dodecane, and the resulting mixture was heated at 180° C. in a nitrogen stream. To the mixture was added dropwise 24.0 grams (110 millimoles) of 4-iodotoluene, and the heating at 180° C. was continued for 5 hours. Water was added to the reaction mixture and the mixture was extracted with about 1 liter of toluene. To assure completion of the reaction, the solvent was removed by distillation, and 40 grams of potassium hydroxide, 400 milligrams of copper iodide, and 24.0 grams (110 millimoles) of 4-iodotoluene were added to the solid residue, followed by reaction of the solid residue with the added iodotoluene at 180° C. for 5 hours in a nitrogen stream. Water was added, and the mixture was extracted with about 1 liter of toluene. The extract was dried over sodium sulfate and then treated with activated clay. The solvent (toluene) was removed by distillation to obtain 5.98 grams (75.7 percent yield) of N,N,N',N'-tetrakis-(4-methylphenyl)-3,3'-dimethylbenzidine (VI), which was recrystallized from a mixed solvent of toluene/acetone/hexane to obtain 4.32 grams (final yield was 54.7 percent) of white crystalline material having a melting point of 174° C. to 175° C. Analysis by high performance liquid chromatography revealed that the product has a high purity of 99.9 percent. The product was identified by NMR.

EXAMPLE II

Preparation of N,N'-bis(4-methylphenyl)-N,N'-bis(4-ethylphenyl)-[1,1'-(3,3'-dimethyl)biphenyl]-4,4'diamine (ETPD):

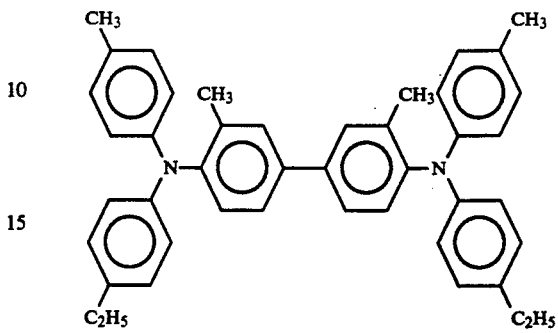

This synthesis was accomplished as illustrated in Example I except that the amount of 4-iodotoluene in the first step was reduced to 15 millimoles (3.3 grams) and in the second step, 26 grams (110 millimoles) of 4-iodoethylbenzene was used instead of 4-iodotoluene. The product was isolated by the addition of water and extraction of the mixture with toluene. The extract was dried over sodium sulfate and treated with activated clay. The solvent was removed by distillation to obtain 6.03 grams of crude (VII). The reaction product was redissolved in toluene and purified by a common column fractionation method using activated silica suspended in heptane and a 1:1 mixture of toluene/heptane as eluent. The product was then recrystallized from a mixed solvent of toluene/acetone/heptane to obtain 3.54 grams (43 percent yield) of white powder N,N'-bis(4-methylphenyl)-N,N'-bis(4-ethylphenyl)-[1,1'-(3,3'-dimethyl)biphenyl]-4,4'diamine with a m.p. (melting point) of 155.5° C.

Measurement of Hole Drift Mobilities

Hole drift mobilities were measured on thin films prepared by casting dilute solutions of a mixture of polysilylene and the above prepared small molecules on an aluminum plate followed by evaporation of the solvent (typically toluene). The film thickness was typically 10 μ (microns). The composition of the film varied from approximately 10 weight percent of the small molecule and 90 weight percent of the polysilylene to 75 weight percent of the small molecule and 25 weight percent of the polysilylene. For example, a film of 11 μ thickness was prepared by dissolving 0.125 gram of poly(methylphenylsilylene) (MW 300,000; molecular weight distribution 2.3) and 0.375 gram of N,N'-bis(4-methylphenyl)-N,N'-bis(4-ethylphenyl)-[1,1'-(3,3'-dimethyl)biphenyl]-4,4'diamine (ETPD) in 5 milliliters toluene and spreading the solution using a bar coating technique on a flat aluminum plate, and allowing the solvent evaporate.

The hole drift mobilities in all the investigated layers were measured by the common known, so called Time-Of-Flight technique which is in detail described by F. J. Dolezalek in *Photoconductivity and Related Phenomena*, J. Mort and D. M. Pai, Eds: Elsevier, N.Y., 1976, page 27, using a nitrogen-pumped dye laser for flash excitation of charge carriers. The duration of the flash was 5 nanoseconds, which is much shorter than the transit time.

Table I illustrates that the hole drift mobilities in poly(methylphenylsilylene) and poly(methyl-p-methoxyphenylsilylene) without any additives measured under the conditions specified in the Table are near $10^{-4}$ $cm^2$/volts per second. Table I also shows that the hole drift modility in inert, electronically inactive polymers, polystyrene and polycarbonate is equal to zero. It also shows that hole drift mobilities in films consisting of ETPD and the inert, electronically inactive binder polymers, polystyrene and polycarbonate varies between $7 \times 10^{-7}$ to $1.8 \times 10^{-3}$ $cm^2$/volts per second. depending on the relative weight ratios of the two components, but is never greater than $1.8 \times 10^{-3}$ $cm^2$/volts per second at the 25:75 polymer:small molecule ratio. Surprisingly, when the same small molecule, ETPD, is molecularly dispersed in transport-active polymers (polymers that by themselves exhibit hole transport), poly(methylphenylsilylene) (PMPS) or poly(methyl-p-methoxyphenylsilylene) (PMMS) at the same weight ratios as above, the hole drift mobilities in films of these compositions are substantially higher, reaching $3 \times 10^{-2}$ $cm^2$/volts per second at the 25:75 PMPS/ETPD weight ratio. This synergistic effect is unexpected; one would expect at best the mobility of the better of the two components, that is the mobility of ETPD. Similarly, when the molecule or structure VI is molecularly dispersed in a polysilylene (PMPS), the resulting hole drift mobility in thin films of the mixture is unexpectedly higher than the hold drift mobility of either the polysilylene, or the small molecule molecularly dispersed at the same weight ratio in the inactive binder polymer, polycarbonate.

TABLE I

Hole Drift Mobilities in Films Containing ETPD at 25° C. and an Electric Field of $3 \times 10^5$ Volts/centimeter

| Binder | Weight Ratio Binder Polymer/Diamine Small Molecule | | | |
|---|---|---|---|---|
| | 100:0 | 80:20 | 50:50 | 25:75 |
| PMPS | $10^{-4}$ | $8 \times 10^{-4}$ | $7 \times 10^{-3}$ | $3 \times 10^{-2}$ |
| PMMS | $8 \times 10^{-5}$ | | $5 \times 10^{-3}$ | $10^{-2}$ |
| PS | — | $2 \times 10^{-5}$ | $7 \times 10^{-4}$ | $1.8 \times 10^{-3}$ |
| PC | — | $7 \times 10^{-7}$ | $2 \times 10^{-5}$ | $8 \times 10^{-4}$ |

PMPS denotes poly(methylphenylsilylene)
PMMS denotes poly(methyl-p-methoxyphenylsilylene)
PC denotes polycarbonate
PS denotes polystyrene.

TABLE II

Hole Drift Mobilities in Films Containing (VI) at 25° C. and an Electric Field of $3 \times 10^5$ Volts/centimeter

| Binder | Weight Ratio Binder Polymer/Diamine Small Molecule | |
|---|---|---|
| | 100:0 | 50:50 |
| PMPS | $10^{-4}$ | $2 \times 10^{-3}$ |
| PC | — | $10^{-5}$ |

Table II shows that the hole drift mobility in a film that contains both the small molecule (VI) and the transport active binder (polysilylene, PMPS) is much higher than the hole mobility in either neat PMPS (a transport-active polymer) or in a film composed of the same small molecule (VI) and a transport-inactive binder (PC).

Photoresponsive imaging members can be prepared by providing for each separate member a titanized Mylar substrate of 75 microns with a silane layer (gamma-aminopropyl methyl diethoxysilane), 0.1 micron in thickness thereover, a polyester adhesive layer thereon in a thickness of 0.1 micron, and depositing thereover with a Balzers vacuum coater a photogenerating layer of trigonal selenium, or vanadyl phthalocyanine. The photogenerating layer had a final thickness of 0.2 micron. More specifically, each of the photogenerator components were evaporated from an electrically heated tantalum boat and the vacuum coater was evacuated to a pressure of $10^{-5}$ Torr. Each of the photogenerator layers were deposited at a rate of 1 to 4 Angstroms/second on the adhesive layer.

Thereafter, the above photogenerator layers present in the respective imaging members were each overcoated with a mixture comprised of the ETPD poly(methylphenylsilylene) (40/60) charge transport layer obtained from Example I, which coating was accomplished as follows. The mixture was added to 13.5 percent by weight in methylene chloride in an amber bottle. The resulting mixture was then coated onto the above photogenerator layers using a multiple clearance film applicator (10 mils gap). The resulting members were then dried at 135° C. for 20 minutes. The transport layer thus obtained had a thickness of 20 microns.

The xerographic electrical properties of the aforementioned imaging members can then be determined by electrostatically charging the surfaces thereof with a corona discharge source until the surface potentials, as measured by a capacitively coupled probe attached to an electrometer, attained an initial value $V_o$ of about −800 volts. After resting for 0.5 second in the dark, the charged members reached a surface potential of $V_{ddp}$, dark development potential, and each member was then exposed to light from a filtered Xenon lamp with a XBO 150 watt bulb. A reduction in surface potential to a $V_{bg}$ value, background potential, due to photodischarge effect was observed. The dark decay in volt/second can be calculated as $(V_o - V_{ddp})/0.5$. The percent of photodischarge was calculated as 100 percent $(V_{ddp} - V_{bg})/V_{ddp}$. The desired wavelength and energy of the expose light was determined by the type of filters placed in front of the lamp. The broad band white light (400 to 700 nanometers) photosensitivity of these imaging members were measured by using an infrared cut-off filter whereas the monochromatic light photosensitivity was determined using narrow band-pass filter.

Other modifications of the present invention may occur to those skilled in the art subsequent to a review of the present application, and these modifications are intended to be included within the scope of the present invention.

What is claimed is:

1. An imaging member consisting essentially of a supporting substrate, a photogenerating layer, and a charge transport layer comprised of a mixture of biphenyl diamine and a polysilylene

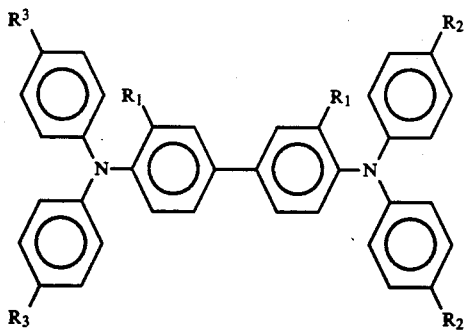

(I)

wherein the biphenyl diamine is N,N'-bis(4-methylphenyl)-N,N'-bis(4-ethylphenyl)-[1,1'-(3,3'-dimethyl)biphenyl]-4,4'-diamine, and wherein the polysilyene is selected from the group consisting of poly(methylphenyl) silylene, poly(cyclohexyl methyl) silylene, poly(betaphenethylmethyl silylene), poly(n-propylmethyl-co-methylphenyl silylene), poly(n-propylmethyl silylene), poly(methylphenyl-co-cyclohexylmethyl) silylene, and poly(methylphenyl-co-p-methoxyphenyl) silylene.

2. An imaging member in accordance with claim 1 wherein the mixture is comprised of from about 10 to about 75 percent by weight of the biphenyl diamine.

3. An imaging member in accordance with claim 1 wherein the mixture is comprised of from about 90 to about 25 percent by weight of the polysilylene.

4. An imaging member in accordance with claim 1 wherein the hole transport layer mixture is situated between the supporting substrate and the photogenerating layer.

5. An imaging member in accordance with claim 1 wherein the supporting substrate is comprised of a conductive metallic substance, or an insulating polymeric composition overcoated with an electrically conductive layer.

6. An imaging member in accordance with claim 1 wherein the supporting substrate is aluminum, or an organic polymeric composition.

7. An imaging member in accordance with claim 1 wherein the photogenerating layer pigment is dispersed in a resinous binder in an amount of from about 5 percent by weight to about 95 percent by weight.

8. An imaging member in accordance with claim 7 wherein the resinous binder is a polyester, poly(vinylbutyral), polycarbonate, poly(vinylformal), poly(vinylcarbazole), poly(vinylchloride), or mixtures thereof.

9. An imaging member in accordance with claim 1 wherein the photogenerating layer pigment is selected from the group consisting of metal free phthalocyanines, metal phthalocyanines, vanadyl phthalocyanines, titanyl phthalocyanines, selenium and selenium alloys.

10. An imaging member in accordance with claim 1 wherein the photogenerating layer pigment is trigonal selenium.

11. An imaging member in accordance with claim 1 wherein the photogenerating layer pigment is a perylene, a squaraine, or a bisazo.

12. A method of imaging or printing which comprises generating an image on the imaging member of claim 1 developing the image generated; transferring the developed image to a suitable substrate; and thereafter affixing the image thereto.

13. A method of imaging or printing which comprises generating an image on the imaging member of claim 1; developing the image generated; transferring the developed image to a suitable substrate; and thereafter affixing the image thereto.

14. An imaging member in accordance with claim 1 wherein the mobility of the holes being transported in the charge transport layer is from about $10^{-4}$ to about $10^{-1}$ cm$^2$/volts second.

15. An imaging member in accordance with claim 1 wherein the mobility of the holes being transported in the hole transport layer is from about $10^{-4}$ to about $10^{-1}$ cm$^2$/volts second.

* * * * *